(12) United States Patent
Holtz

(10) Patent No.: US 9,240,844 B2
(45) Date of Patent: Jan. 19, 2016

(54) OPTOCOUPLER ARRANGEMENT AND INPUT AND/OR OUTPUT MODULE

(71) Applicant: Siemens Aktiengesellschaft, Munich (DE)

(72) Inventor: Stefan Holtz, Chemnitz (DE)

(73) Assignee: Siemens Aktiengesellschaft, Munich (DE)

( * ) Notice: Subject to any disclaimer, the term of this patent is extended or adjusted under 35 U.S.C. 154(b) by 149 days.

(21) Appl. No.: 14/186,664

(22) Filed: Feb. 21, 2014

(65) Prior Publication Data

US 2014/0239205 A1    Aug. 28, 2014

(30) Foreign Application Priority Data

Feb. 22, 2013    (EP) .................................... 13156405

(51) Int. Cl.
| | |
|---|---|
| *H04B 1/58* | (2006.01) |
| *H04B 10/80* | (2013.01) |
| *H03K 17/605* | (2006.01) |
| *H03K 19/003* | (2006.01) |
| *G05B 19/05* | (2006.01) |

(52) U.S. Cl.
CPC ............ *H04B 10/802* (2013.01); *H03K 17/605* (2013.01); *H03K 19/00353* (2013.01); *G05B 19/054* (2013.01); *G05B 2219/33204* (2013.01)

(58) Field of Classification Search
CPC ...... H04B 1/587; H04B 10/00; H04B 10/802; H04B 10/1123; H04B 10/1125; H04B 10/1127
USPC .......................................................... 250/551
See application file for complete search history.

(56) References Cited

U.S. PATENT DOCUMENTS

| | | | |
|---|---|---|---|
| 5,909,660 | A | 6/1999 | Foote |
| 2007/0094434 | A1 | 4/2007 | Engl et al. |

FOREIGN PATENT DOCUMENTS

| | | |
|---|---|---|
| EP | 1 770 457 | 2/2009 |
| EP | 2 506 436 | 10/2012 |
| GB | 2 241 126 | 8/1991 |

*Primary Examiner* — Renee D Chavez
(74) *Attorney, Agent, or Firm* — Cozen O'Connor

(57) ABSTRACT

An optocoupler arrangement for signal transmission with galvanic separation includes a first optocoupler with a first input path and a first output path, a second optocoupler with a second input path and a second output path, wherein the first and second input paths are arranged in series with a connecting switching device, and wherein an actuation circuit has first and second input signals as inputs, and first, second and third outputs as outputs, and the actuation circuit is configured such that, as a function of a first switching state related to the first and second signal inputs, the connecting switching device is actuated, and with respect to either a second or a third switching state, either a first switching device assigned to the first input path of the first optocoupler or a second switching device assigned to the second input path of the second optocoupler is actuated.

7 Claims, 2 Drawing Sheets

| | 1 | 2 | T1 | T2 | T3 | Coupler 1 | Coupler 2 |
|---|---|---|---|---|---|---|---|
| S4 | 0 | 0 | 0 | 0 | 0 | 0 | 0 |
| S3 | 1 | 0 | 1 | 0 | 0 | 1 | 0 |
| S2 | 0 | 1 | 0 | 1 | 0 | 0 | 1 |
| S1 | 1 | 1 | 0 | 0 | 1 | 1 | 1 | ns
OPTOCOUPLER ARRANGEMENT AND INPUT AND/OR OUTPUT MODULE

BACKGROUND OF THE INVENTION

1. Field of the Invention

The invention relates to an optocoupler arrangement for signal transmission with galvanic separation, and to an input and/or output module within industrial automation technology having input and/or output channels, where the channels have the optocoupler arrangement.

2. Description of the Related Art

An optocoupler is an electronic component and is used to transmit a signal between two galvanically separated current circuits. An optocoupler preferably includes an optical sensor, such as a light-emitting diode, and an optical receiver, such as a photo transistor, which are preferably accommodated in a light-impermeable housing.

EP 1 770 457 B1 discloses an optocoupler arrangement for the galvanic separation of signals. EP 1 770 457 B1 also describes a peripheral module, such as an input or output module, for an automation device, which has this optocoupler arrangement.

In electronic modules, in which optocouplers are used for the galvanic separation of signals, a power loss, which is related to the actuation of the optocoupler, increases in a linear manner with the number of optocouplers to be actuated.

In order to minimize this power loss, devices such as magnetic couplers and/or capacitive couplers were previously used. These devices are, however, disadvantageous in that they are generally more expensive than optocouplers and require additional circuits for supplying the secondary side.

With respect to process automation, there may well be 10,000 inputs/outputs to be controlled or detected in industrial systems. This high number of inputs/outputs must be divided between input/output modules for detection purposes. To this end, these input/output modules are generally configured to be multichannel, having an optocoupler per channel in each instance.

SUMMARY OF THE INVENTION

It is an object of the present invention to provide an optocoupler arrangement or an input/output module, in which the power loss caused by the optocoupler can be reduced.

This and other objects and advantages are achieved in accordance with the invention by an optocoupler arrangement for signal transmission during galvanic separation that includes a first optocoupler with a first input path and a first output path, a second optocoupler with a second input path and a second output path, a first signal input, a second signal input, where the first input path and the second input path is arranged in a series circuit with a connecting switching device such that the connecting switching device connects the first input path to the second input path, where an actuation circuit has the first signal input and the second signal input as inputs, and has a first output, a second output and a third output as outputs, the actuation circuit is configured here such that as a function of a first switching state related to the first and second signal input, the connecting switching device is controlled and with respect to a second switching state or a third switching state a first switching device, which is assigned to the first input path of the first optocoupler or a second switching means, which is assigned to the second input path of the second optocoupler, is actuated. In this arrangement, an optocoupler arrangement is realized with the advantage of saving energy, in which a switching state is implemented dependent on the series connection of the first and second optocoupler. In general, optocouplers use devices, such as infrared diodes, in order to control phototransistors. Infrared light-emitting diodes of this type have a very low flux voltage of a maximum of 1.2 volts. With a flux voltage of 1.2 volts, two optocouplers can be connected in series with one another, such as at a system voltage of 3.3 volts. When actuating two series-connected optocouplers, the same power loss is incurred as with the actuation of one optocoupler. In the event that the two signal inputs of the optocoupler arrangement are actuated at the same time, in other words both optocouplers must also output a signal, these two optocouplers are connected in series with one another in terms of circuitry in the event of simultaneous actuation. The components required herefor are preferably a current source, which provides the required infrared light-emitting diode current irrespective of the input voltage, logic gates, such as a NAND gate and/or bipolar transistors.

In a preferred embodiment, an optocoupler arrangement is obtained with a current source, which is connected to a first side of the first input path, where a second side of the first input path is connected to a first connection of the connecting switching device and a first side of the second input path is connected to a second connection of the connecting switching device and a second side of the second input path is connected to a point, which allows for current to flow from the current source, via the first input path and the connecting switching device, to the second input path back to the current source. The point can be regarded as a ground reference potential. The described current path now describes the instance whereby both optocouplers are activated at the same time. This switching state-dependent series connection of the optocouplers is realized in the actuation circuit such that if the first signal input "1" is conductive and the second signal input is likewise "1" conductive, the connecting switching device is actuated such that the same current can flow from the current source through both optocouplers and, thus, contrary to conventional optocoupler arrangements, not every optocoupler has to be supplied with its own current.

In a further embodiment, the first switching device is connected with a first connection to the second side and a second connection of the first switching device is connected to the point M. The first switching device is assigned to the first optocoupler and is to ensure that a current flow develops through the first input path upon corresponding actuation. As a result, the actuation circuit is configured with the first switching device, in the event that only the first signal input "1" is conductive, to actuate the first switching device so that a current can flow from the current source via the first input path of the first coupler, the current flowing across the first switching device back to a ground reference point, so that the first optocoupler is activated.

In order also to individually activate the second optocoupler, the second switching device with a first connection is connected to the first side of the second input path and a second connection of the second switching device is connected to the current source. In the event that only the second signal input "1" is conductive, a current can flow from the current source via the second switching device, across the second input path, to a ground reference potential, so that the second optocoupler can be activated individually.

In a preferred embodiment and in order to have the option of actuating the switching device accordingly, the first output is connected to a third connection of the first switching device, the second output is connected to a third connection of the second switching device and the third output is connected to a third connection of the connecting switching device.

With the optocoupler arrangement, the actuation circuit is configured for logically linking the first signal input and the second signal input such that, with a signal at the first signal input, the first optocoupler is activated, and with a signal at the second signal input, the second optocoupler is activated, and with a signal at the first and at the second signal input in each case, the first and the second optocoupler are activated to save energy in a series circuit.

It is also an object of the invention to provide an input and/or output module within industrial automation technology having at least four channels, where a first channel and a second channel are configured with a first optocoupler arrangement, and a third channel and a fourth channel are configured with a second optocoupler arrangement.

In a system in which the optocoupler arrangement is used, e.g., a modular control system with input/output modules, for instance, the energy saving assists with adhering to system defaults, e.g., with respect to a maximum possible system expansion, defined by the overall power loss.

In an automation component in which the optocoupler arrangement is used, this helps to reduce waste heat, for instance, which thermally distresses the electrical components used in the automation component and thus increases their service life. Supply energy is likewise saved, which reduces the operating costs and also brings about the possibility of using smaller power supply units, which in turn reduces the system costs.

If the optocoupler arrangement is used in a control cabinet, the reduced development of heat helps a plant manufacturer to save on costs and energy when cooling the control cabinet.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The drawing shows an exemplary embodiment, in which.

DETAILED DESCRIPTION OF THE PREFERRED EMBODIMENTS

Figure 1:
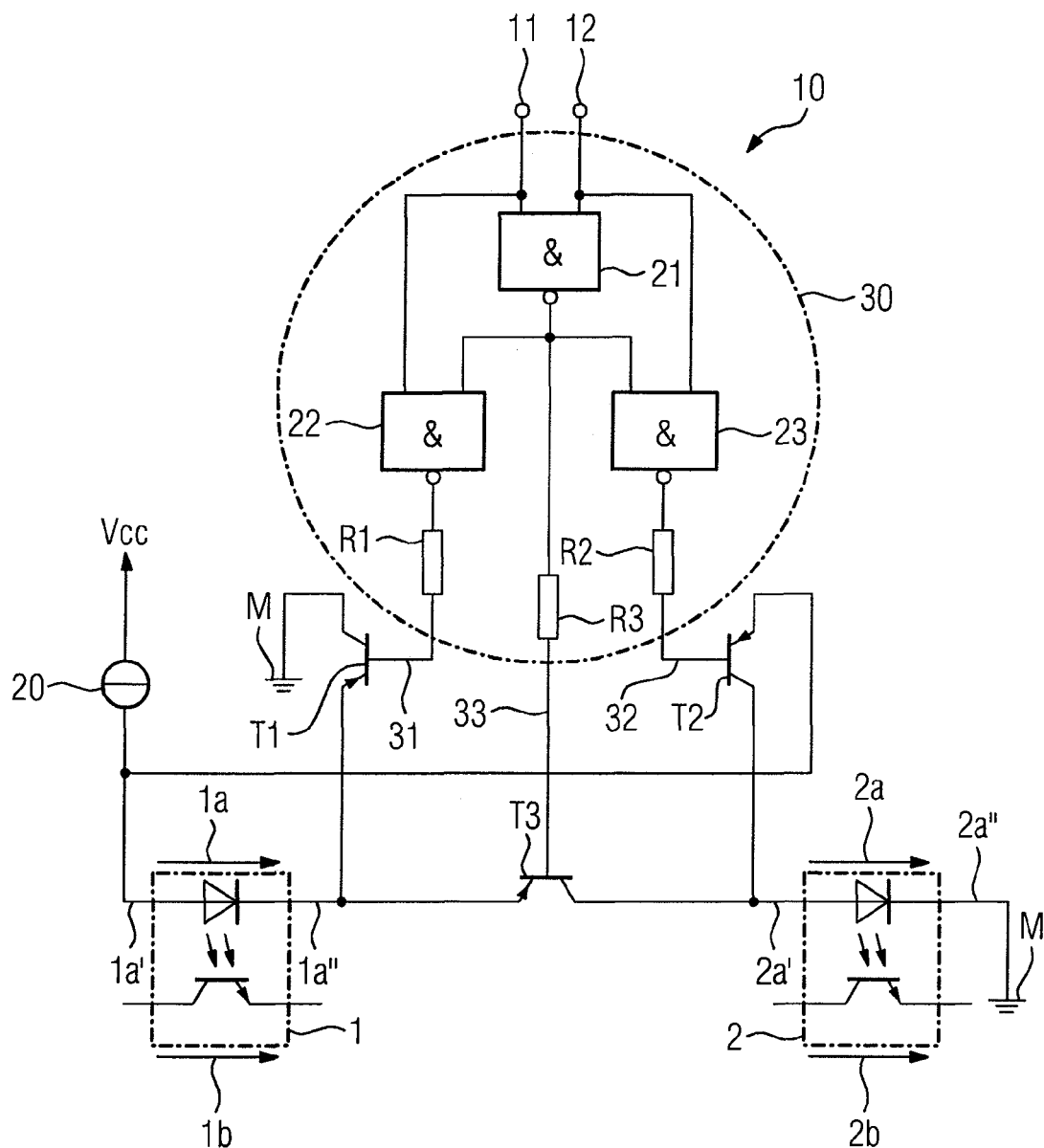
FIG. 1 shows an optocoupler arrangement in accordance with the invention.

With reference to FIG. 1, shown therein is an optocoupler arrangement 10 for signal transmission during galvanic separation. Signals that may be present across a first signal input 11 and a second signal input 12, are to be forwarded, in a galvanically separated manner, by a first optocoupler 1 and a second optocoupler 2. To this end, the first optocoupler 1 has a first input path 1a and a first output path 1b, and the second optocoupler 2 has a second input path 2a and a second output path 2b.

If current is flowing through the first input path 1a, the first optocoupler 1 is activated and a current flow can likewise occur in the first output path 1b, if current is flowing through the second input path 2a of the second optocoupler 2, the second optocoupler 2 is activated and a current can likewise flow in the second output path 2b.

The first input path 1a and the second input path 2a are arranged with a connecting switching device T3 in a series circuit, the connecting switching device T3 connecting the first input path 1a to the second input path 2a.

An actuation circuit 30 has the first signal input 11 and the second signal input 12 as inputs, and a first output 31, a second output 32 and a third output 33 as outputs.

Here, the actuation circuit 30 is configured with a first AND element 21, a second AND element 22 and a third AND element 23. The respective outputs of the AND elements 21, 22, 23 are configured to be negated.

Accordingly, the actuation circuit 30 is configured such that, as a function of a first switching state S1 related to the first and second signal input 11, 12, the connecting switching device T3 is actuated, and with respect to a second switching state S2 or a third switching state S3, a first switching device T1, which is assigned to the first input path 1a of the first optocoupler 1 or a second switching device T2, which is assigned to the second input path 2a of the second optocoupler 2, is actuated.

Figure 2:
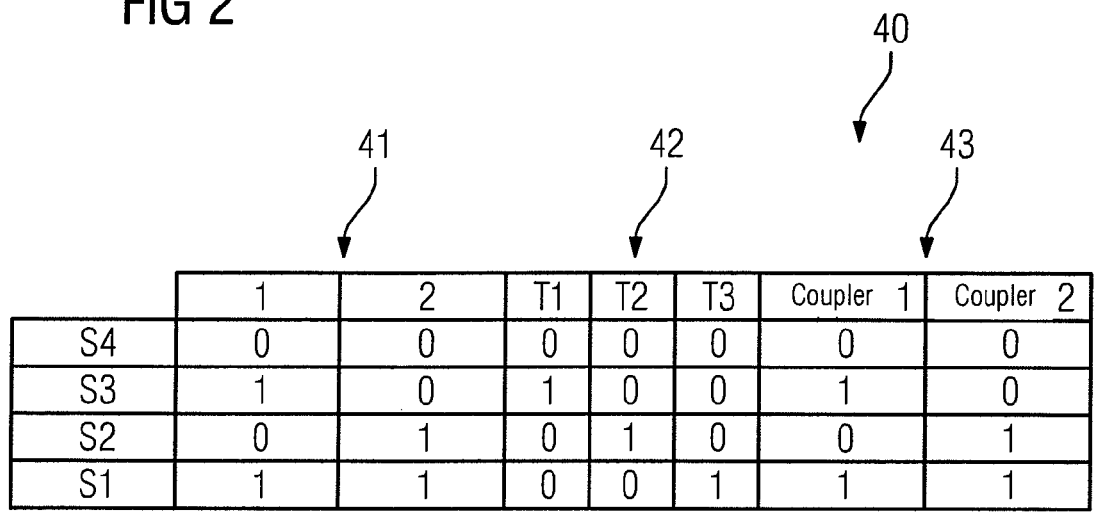
FIG. 2 shows a table of states for the switching states of the signal inputs in accordance with the invention.

FIG. 2 shows a table of states 40, in which the switching states S1, ..., S4 are arranged in the first column. The state of the signal inputs 41 is mapped with "0" "1". The state 42 of the different switching devices T1, T2, T3 is likewise mapped with "0" or "1". The state 43 of the individual optocouplers is likewise mapped with "0" and "1".

The first switching state S1, in which the first signal input 11 and the second signal input 12 conduct signals, is explained with reference to FIG. 1. A "1" signal is present in each instance at the first signal input 11 and the second signal input 12. Since the first AND element 21 is configured as a NAND gate, a "0" is present on one of the inputs of the second AND element 22. The other input of the second AND element 22 has a "1", because the first signal input 11 was connected through the other input of the second AND element 22. Since the second AND element 22 is also configured as a AND gate, its output now has a "1". This "1" signal is applied to the first switching device T1 via a first series resistor R1 as the first output 31.

Since the switching devices T1, T2, T3 are configured as PNP transistors, the actuation occurs with voltage level "0" at the base. Since, as previously described, a "1" signal is applied to the base of the first switching device T1, the first switching device T1 is not actuated.

A similar technical interconnection applies to the branch of the second signal input 12 up to the second switching device T2, the second switching device T2 is also not actuated here.

In the event that both signal inputs 11, 12, are conductive "1", the first switching device T1 and the second switching device T2 block. But the connecting switching device T3 is actuated such that it is conducting. A current can flow from the current source 20, due to a supply voltage connection Vcc, via the first input path 1a, via the third switching device T3, via the second input path 2a to a point M. The current flow through the two optocouplers 1,2 activates the first optocoupler 1 and the second optocoupler 2 at the same time. With the first switching state S1, energy is accordingly saved by way of the switching state-dependent series connection of the first optocoupler 1 and the second optocoupler 2.

Figure 3:
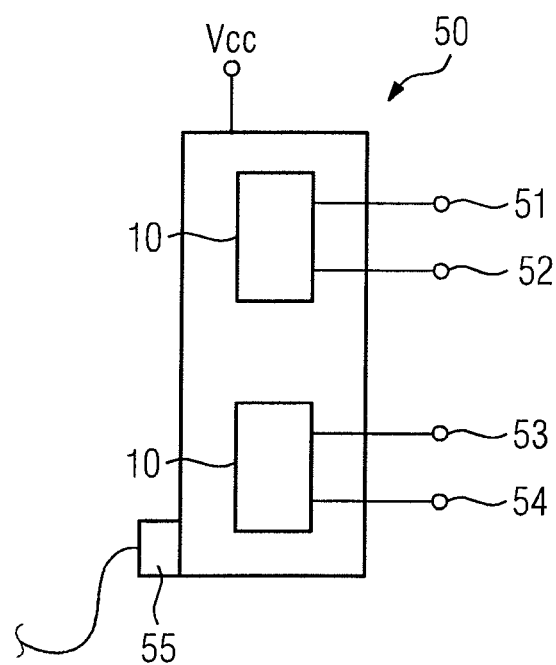
FIG. 3 shows an automation component, i.e., an input/output module, with two optocoupler arrangements in accordance with the invention.

With reference to FIG. 3, shown therein is an input and/or output module 50 within industrial automation technology having at least four channels 51, 52, 53, 54, where a first channel 51 and a second channel 52 is configured with a first optocoupler arrangement 10 and a third channel 53 and a fourth channel 54 is configured with a second optocoupler arrangement 10. For a supply with a voltage, the input and/or output module 50 has a supply voltage connection Vcc. For communication with a superordinate automation device, the input and/or output module 50 has a bus connection 55.

An automation system including a communication module, which establishes a connection between a central controller and the actual input and/or output modules, such as decentralized peripheral modules, will accordingly comprise a plurality of input and/or output modules, in the case of a large industrial process, which are connected to a communication module. The energy supply of the decentralized peripheral modules, in other words of the input and/or output modules, is generally assumed by the communication module. As a result, the number of input/output modules that are operable on a communication module is dependent on the output of a power supply assigned to the communication module. In order to be able to adhere to the system defaults in respect of the number of operable input/output modules, each input/output module is restricted to a maximum power consumption.

In an exemplary case, the power consumption of a functional part of the input/output module is restricted to 8 mA. A module to be developed is to actuate four triacs in an optically separated manner and for this purpose use no more than 8 mA. Due to their function, optically separated triacs have a very high energy requirement of 4 mA. If these 4 triacs are now actuated in parallel in a conventional manner, an energy requirement of 16 mA results at the same time when actuating all four channels. This energy requirement exceeds the maximum permissible value and, thus, the system defaults in respect of a maximum system design. It would therefore not be possible for this automation system to develop an input/output module, which contains four triac channels and which can actuate these at the same time.

In order to realize an input/output module, which has the maximum current settings, a current-saving actuation circuit is required for the triacs. The current required to actuate a triac cannot reduce below a 4 mA limit on account of physical restrictions. In order to be able to retain the system defaults, the optocoupler arrangement 10 is used. Here, a system voltage that is used amounts to 3.5 V, for instance, and a drop in voltage across the first optocoupler 1 and the second optocoupler 2 amounts to a maximum of 1.1 V in each instance.

The switching devices T1, T2 and T3, such as transistors, are actuated as a function of the logical states of the first signal input 11 and the second signal input 12. The interconnection of the switching devices T1, T2 and T3 ensures that the first optocoupler 1 and the second optocoupler 2 are either supplied with 4 mA individually or consecutively and are thus regulated.

As a result of this circuit, an actuation current for two channels is restricted to an overall maximum of 4 mA, irrespective of the switching state. With the power consumption restricted as a result to a maximum 8 mA for four channels, it is possible to develop a four-channel triac module which adheres to the system defaults.

Thus, while there have shown, described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements which perform substantially the same function in substantially the same way to achieve the same results are within the scope of the invention.

Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. An optocoupler arrangement for signal transmission with galvanic separation, comprising:
    a first optocoupler having a first input path and a first output path;
    a second optocoupler having a second input path and a second output path;
    a first signal input;
    a second signal input;
    a connecting switching device, the first and second input paths being arranged in a series circuit with the connecting switching device such that the connecting switching device connects the first input path to the second input path;
    a first switching device assigned to the first input path of the first optocoupler;
    a second switching device assigned to the second input path of the second optocoupler; and
    an actuation circuit having a first output, a second output and a third output, the first signal input and the second signal input forming inputs of the actuation circuit, the actuation circuit being configured such that, as a function of a first switching state related to the first and second signal inputs, the connecting switching device is actuated, and with respect to one of (i) a second switching stated and (ii) a third switching state, the first switching device assigned to the first input path of the first optocoupler is actuated or the second switching device assigned to the second input path of the second optocoupler is actuated.

2. The optocoupler arrangement as claimed in claim 1, further comprising:
    a current source connected to a first side of the first input path;
    wherein a second side of the first input path is connected to a first connection of the connecting switching device and a first side of the second input path is connected to a second connection of the connecting switching device and a second side of the second input path is connected to a point, which allows current to flow from the current source via the first input path and the connecting switching device, to the second input path and back to the current source.

3. The optocoupler arrangement as claimed in claim 2, wherein the first switching device connected to the second side of the first input path with a first connection, and a second connection of the first switching device is connected to the point.

4. The optocoupler arrangement as claimed in claim 3, wherein the second switching device with the first connection is connected to the first side of the second input path and a second connection of the second switching device is connected to the current source.

5. The optocoupler arrangement as claimed in claim 1, wherein the first output is connected to a third connection of the first switching device, the second output is connected to a third connection of the second switching device and the third output is connected to a third connection of the connecting switching device.

6. The optocoupler arrangement as claimed in claim 1, wherein the actuation circuit logical link the first signal input and the second signal input, the actuation circuit being configured such that with a signal at the first signal input, the first optocoupler is activated, and with a signal at the second signal input, the second optocoupler is activated, and with each signal at the first and at the second signal input, the first and the second optocoupler are activated to save energy in the series circuit.

7. An input and or output module within industrial automation technology having at least four channels, wherein a first channel and a second channel are configured with a first optocoupler arrangement as claimed in claim 1; and wherein a third channel and a fourth channel are configured with a second optocoupler arrangement as claimed in claim 1.

* * * * *